United States Patent
Qi et al.

(10) Patent No.: US 8,183,920 B2
(45) Date of Patent: May 22, 2012

(54) VARIABLE GAIN AMPLIFIER WITH REDUCED POWER CONSUMPTION

(75) Inventors: Jieming Qi, Austin, TX (US); David W. Boerstler, Round Rock, TX (US); Minhan Chen, Cary, NC (US); Hayden C. Cranford, Jr., Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/828,238

(22) Filed: Jun. 30, 2010

(65) Prior Publication Data
US 2012/0001691 A1 Jan. 5, 2012

(51) Int. Cl.
*H03F 3/45* (2006.01)
(52) U.S. Cl. ............................................. 330/258; 330/9
(58) Field of Classification Search .............. 330/9, 254, 330/258
See application file for complete search history.

(56) References Cited

U.S. PATENT DOCUMENTS
6,690,173 B2 * 2/2004 Blades .......................... 330/258
* cited by examiner

*Primary Examiner* — Khanh Nguyen
(74) *Attorney, Agent, or Firm* — Patrick E. Caldwell, Esq.; The Caldwell Firm, LLC

(57) ABSTRACT

A variable gain amplifier includes a first common mode (CM) node configured to receive a first differential signal of a pair of differential signals. A first regulator couples to the first CM node, the first regulator being configured to generate a first CM offset. A second CM node is configured to receive a second differential signal of the pair of differential signals. A second regulator couples to the second CM node, the second regulator being configured to generate a second CM offset. In one embodiment, the first CM offset and the second CM offset together comprise a net CM offset, the net CM offset being configured to replace a current source net offset.

19 Claims, 3 Drawing Sheets

VARIABLE GAIN AMPLIFIER WITH REDUCED POWER CONSUMPTION

TECHNICAL FIELD

The present disclosure relates generally to the field of electrical circuits and amplifiers and, more particularly, to a variable gain amplifier with reduced power consumption.

BACKGROUND

Modern communication systems often seek to transmit a large amount of information in a short period of time. Early solutions sought to increase the clock speed of communications systems, thereby increasing the rate such systems could process serial input. While clock speeds have increased, such increases are sometimes insufficient or inappropriate for a particular application. As such, industry has developed alternative approaches to high-speed data transmission.

One such approach to provide high-speed bandwidth is a high speed serial (HSS) implementation referred to as "serialization/deserialization" (SERDES). Generally, a SERDES transmitter divides a serial signal into a number of parallel signals for parallel transmission to a SERDES receiver. Generally, a SERDES receiver recombines the parallel signals into the original serial signal.

Typical SERDES receivers include a variable gain amplifier (VGA). Common SERDES VGA applications use differential signals. As such, VGAs are frequently subject to common mode voltage mismatches caused by the ordinary operation of field effect transistors (FETs), current mirrors, and various passive elements of the VGA.

Typical systems use Inter-Digital Analog Converters (IDACs) to offset common mode voltage mismatches. Typical IDAC-based approaches modulate a current flowing through a specified termination resistor, calibrated to the common mode offset. However, this approach frequently expends significant power, which contributes to the overhead for the VGA itself and the SERDES receiver as a whole.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A variable gain amplifier includes a first common mode (CM) node configured to receive a first differential signal of a pair of differential signals. A first regulator couples to the first CM node, the first regulator being configured to generate a first CM offset. A second CM node is configured to receive a second differential signal of the pair of differential signals. A second regulator couples to the second CM node, the second regulator being configured to generate a second CM offset. In one embodiment, the first CM offset and the second CM offset together comprise a net CM offset, the net CM offset being configured to replace a current source net offset.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
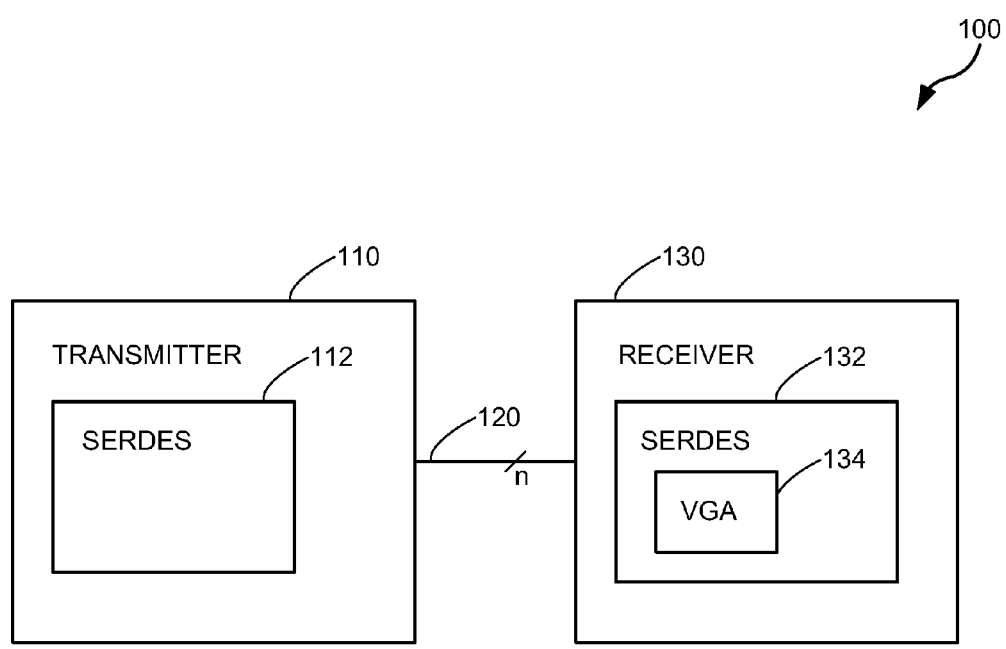
FIG. 1 illustrates a block diagram showing a communications system in accordance with a preferred embodiment.

The particular values and configurations discussed in these non-limiting examples can be varied and are cited merely to illustrate at least one embodiment and are not intended to limit the scope of the disclosure.

In the following discussion, numerous specific details are set forth to provide a thorough understanding of the present disclosure. Those skilled in the art will appreciate that the present disclosure may be practiced without such specific details. In other instances, well-known elements have been illustrated in schematic or block diagram form in order not to obscure the present disclosure in unnecessary detail. Additionally, for the most part, details concerning network communications, electro-magnetic signaling techniques, user interface or input/output techniques, and the like, have been omitted inasmuch as such details are not considered necessary to obtain a complete understanding of the present disclosure, and are considered to be within the understanding of persons of ordinary skill in the relevant art.

As will be appreciated by one skilled in the art, the present disclosure may be embodied as a system, method, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to the drawings, FIG. 1 is a high-level block diagram illustrating certain components of a communications system 100, in accordance with a preferred embodiment. System 100 includes a transmitter 110 coupled to a receiver 130 via a communications link 120.

Transmitter 110 is an otherwise conventional transmitter configured for high-speed communications. Specifically, transmitter 110 includes serializer/deserializer (SERDES) 112. Generally, SERDES 112 is an otherwise conventional SERDES transmitter. In one embodiment, SERDES 112 is configured for high-speed serial (HSS) operations. In the illustrated embodiment, transmitter 110 couples to communications link 120.

In the illustrated embodiment, communications link 120 is an otherwise conventional communications link, modified as described herein. Generally, communications link 120 can be configured in any suitable transmission medium, including, for example, optical, wireline, and/or wireless transmission media. In the illustrated embodiment, communications link 120 includes n signal paths. In one embodiment, communications link 120 is configured for HSS operations.

In the illustrated embodiment, receiver 130 couples to communications link 120. Generally, receiver 130 is configured to receive transmitted signals from transmitter 110, via communications link 120. In the illustrated embodiment, receiver 130 includes SERDES 132. Generally, SERDES 132 is an otherwise conventional SERDES receiver, modified as described herein. In one embodiment, SERDES 132 is configured for high-speed serial (HSS) operations.

In the illustrated embodiment, SERDES 132 includes one or more variable gain amplifiers (VGA) 134. In one embodiment, VGA 134 is a front-end receiver circuit and is configured as described in herein. In the illustrated embodiment, FIG. 1 shows SERDES 132 configured with a single VGA 134, for clarity. One skilled in the art will understand that in other embodiments, SERDES 132 can include a plurality of VGAs 134.

Generally, in operation, transmitter 110 receives a serial (HSS) signal for transmission to receiver 130. SERDES 112 splits the received serial signal into a number (n) of parallel signals and transmits the parallel signals to receiver 130 through communications link 120. SERDES 132 receives parallel signals and recombines the received parallel signals into the original serial signal. In one embodiment, one or more VGAs 134 receive one of the parallel signals for amplification before recombination. In one embodiment, one or more VGAs 134 amplify the recombined serial signal. As described in more detail below, VGA 134 offers significant advantages over prior art approaches, particularly in terms of power consumption.

Figure 2:
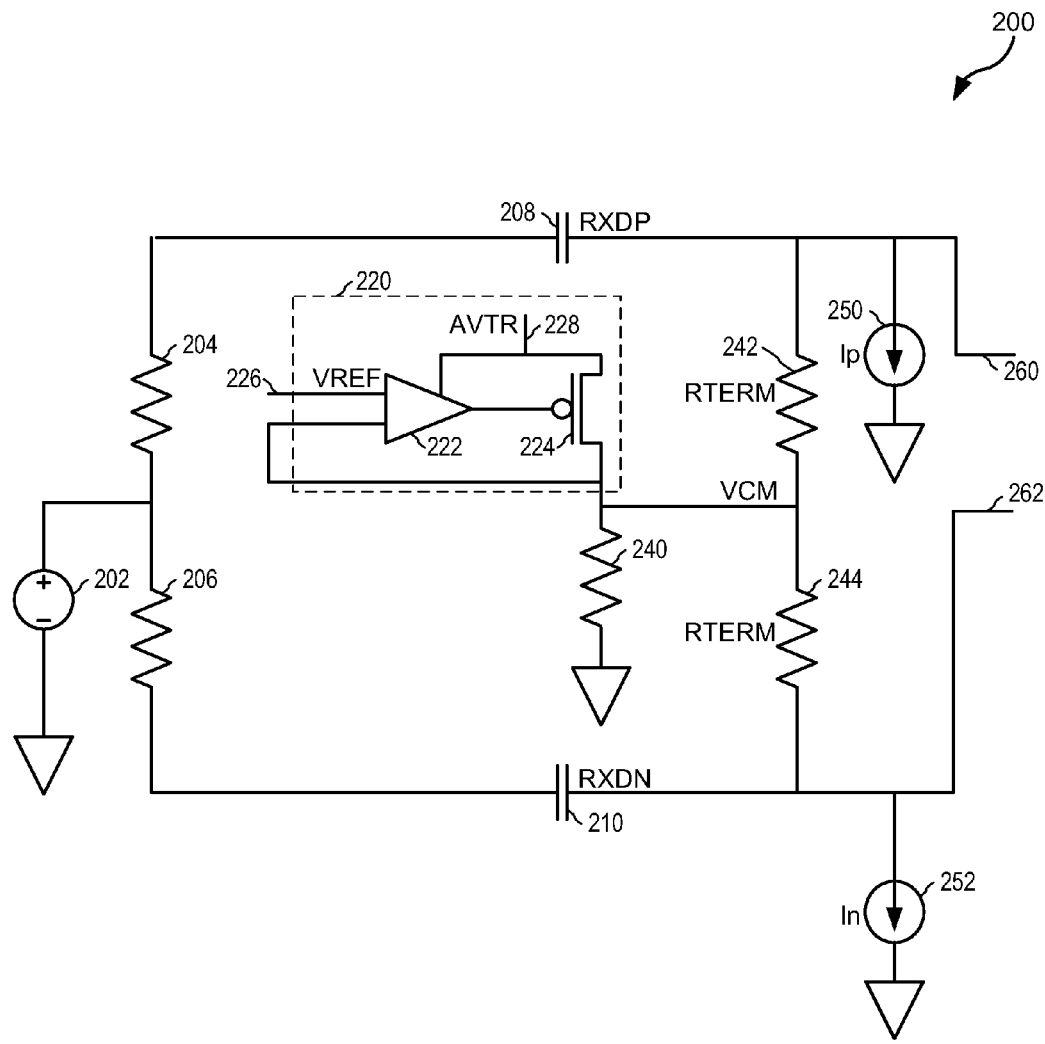
FIG. 2 illustrates a high-level circuit diagram showing a variable gain amplifier (VGA) in accordance with the Prior Art.

For example, FIG. 2 illustrates a VGA 200 in accordance with the prior art. As shown, VGA 200 includes a conventional voltage source 202 coupled to two conventional resistors 204 and 206. Each resistor 204 and 206 couples to a conventional capacitor 208 and 210, respectively. As shown, capacitor 208 represents an input node of a differential signal, identified as "RXDP." Similarly, capacitor 210 represents an input node of a differential signal, identified as "RXDN."

Each input node couples to a termination resistor. As shown, node RXDP couples to resistor RTERM 242. Similarly, node RXDN couples to resistor RTERM 244. In typical applications, RTERM is configured at 50 ohms. Each of RTERM 242 and 244 couples to a common node, identified as VCM. Node VCM couples to a voltage regulator circuit 220 and a conventional resistor 240, which couples to ground.

Voltage regulator circuit 220 includes a conventional operational amplifier (OpAmp) 222, coupled to a conventional p-type field effect transistor (FET) 224. Both OpAmp 222 and FET 224 receive feedback signal AVTR 228. Also, as shown, voltage regulator 220 (specifically, OpAmp 222) receives reference voltage VREF 226. One skilled in the art will appreciate that voltage regulator circuit 220 is shown in a common configuration.

Generally, voltage regulator circuit 220 regulates the gain of received differential signals (RXDP and RXDN) into output signals 260 and 262. One skilled in the art will appreciate that, as such, common mode voltage inconsistencies can arise, affecting the voltage at node VCM. As described above, to address this problem, some prior art SERDES VGA approaches use IDACs to control current through terminal resistors. As shown, VGA 200 includes IDACs 250 and 252.

As shown, IDAC 250 couples to input node RXDP and modulates current through RTERM 242. Specifically, IDAC 250 delivers a variable current Ip. Similarly, IDAC 252 couples to input node RXDN and modulates current through RTERM 244. Specifically, IDAC 252 delivers a variable current In. IDAC 250 and IDAC 252 are typically programmable according to the calibration range required by the application. As described above, this configuration can consume a significant amount of power, relative to the power budget for VGA 200.

Specifically, in operation, either IDAC 250 or IDAC 252 actively deliver current at any particular time, depending on the polarity necessary to offset nodes RXDP and RXDN. Further, voltage regulator 220 drives the VCM node to a fixed voltage, depending on whether VGA 200 is operating in a direct current (DC) or alternating current (AC) coupled mode. In AC coupled mode, the offset voltage is equal to the IDAC current multiplied by the RTERM resistance. In DC coupled mode, where the source resistance is typically the same as the RTERM resistance, the DC coupled mode offset is half of the AC coupled mode offset. Thus, for a 50 milliVolt (mV) offset range, the typical maximum IDAC current is 1 mA for AC coupled mode and 2 milliAmperes (mA) for DC coupled mode. In some embodiments, the system DC common mode voltage is well-defined. Generally, as used herein, "well-defined" means specified in a predetermined range.

One skilled in the art will appreciate that, in the prior art, the power consumed in the generation and application of the offset currents can be considerable relative to the power consumption of other VGA 200 elements. Further, as shown, the offset calibration is highly dependent on the gain amplification. The embodiments disclosed herein overcome these and other disadvantages.

Figure 3:
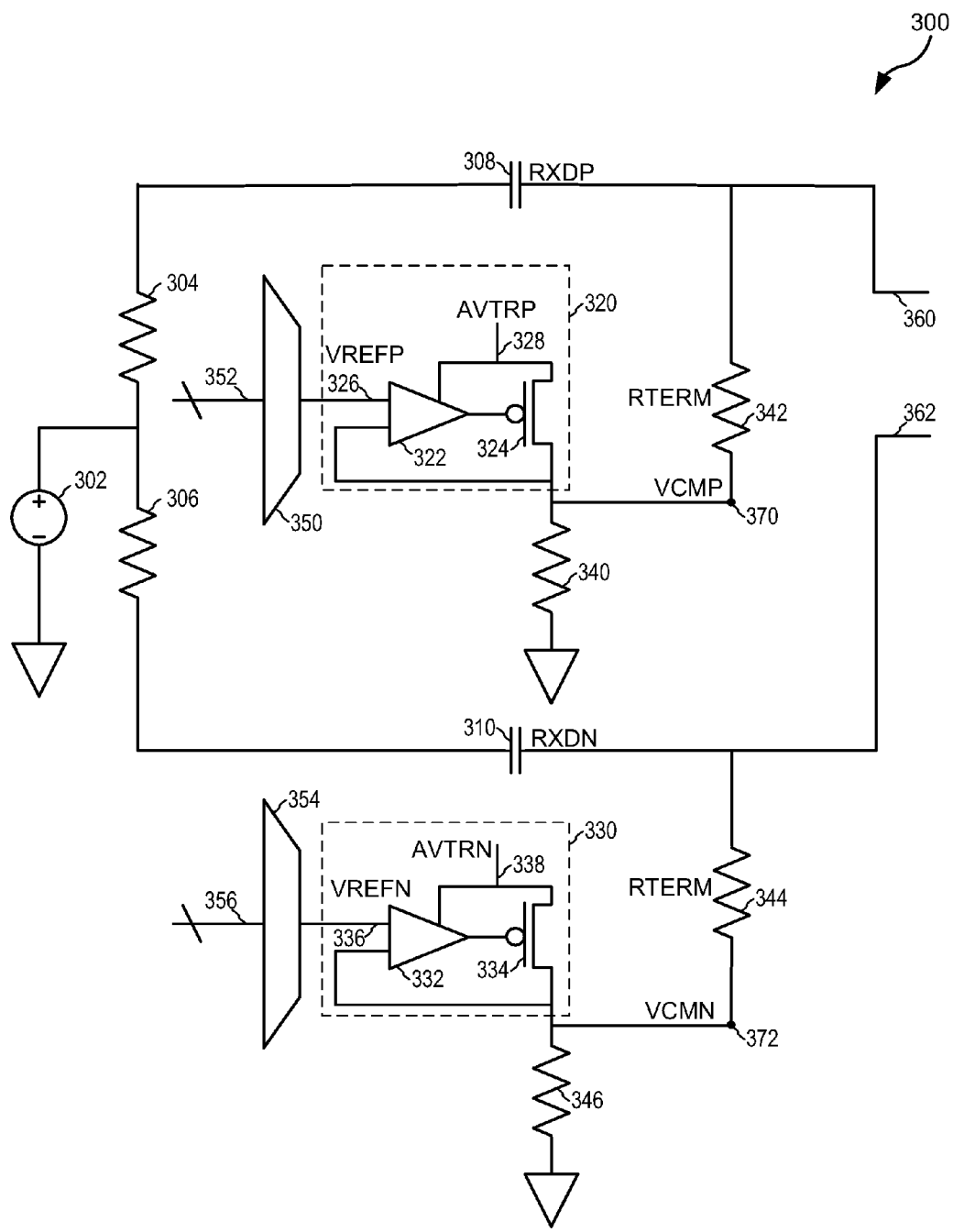
FIG. 3 illustrates a high-level circuit diagram showing a variable gain amplifier (VGA) in accordance with a preferred embodiment.

Specifically, FIG. 3 illustrates a VGA 300 in accordance with one embodiment. In the illustrated embodiment, VGA 300 includes an otherwise conventional voltage source 302 coupled to two otherwise conventional resistors 304 and 306. In the illustrated embodiment, each resistor 304 and 306 couples to an otherwise conventional capacitor 308 and 310, respectively. In the illustrated embodiment, capacitor 308 represents an input node of a differential signal, identified as "RXDP." Similarly, in the illustrated embodiment, capacitor 310 represents an input node of a differential signal, identified as "RXDN."

Each input node couples to a termination resistor. As shown, node RXDP couples to resistor RTERM 342. RTERM 342 couples to a common mode (CM) node, identified as VCMP 370. Node VCMP 370 couples to a voltage regulator circuit 320 and an otherwise conventional resistor 340, which couples to ground.

Similarly, node RXDN couples to resistor RTERM 344. RTERM 344 couples to a CM node, identified as VCMN 372. Node VCMN 372 couples to a voltage regulator circuit 330 and an otherwise conventional resistor 346, which couples to ground.

In the illustrated embodiment, voltage regulator circuit 320 includes an otherwise conventional OpAmp 322, coupled to an otherwise conventional p-type FET 324. In the illustrated embodiment, both OpAmp 322 and FET 324 receive feedback signal AVTRP 328. Also, in the illustrated embodiment, voltage regulator 320 (specifically, OpAmp 322) receives reference voltage VREFP 326. In the illustrated embodiment, VREFP 326 is the output of an otherwise conventional multiplexor (MUX) 350, which selects from a plurality of voltage reference signals 352, based on received control signals (not shown).

Similarly, in the illustrated embodiment, voltage regulator circuit 330 includes an otherwise conventional OpAmp 332, coupled to an otherwise conventional p-type FET 334. In the illustrated embodiment, both OpAmp 332 and FET 334 receive feedback signal AVTRN 338. Also, in the illustrated embodiment, voltage regulator 330 (specifically, OpAmp 332) receives reference voltage VREFN 336. In the illustrated embodiment, VREFN 336 is the output of an otherwise conventional MUX 354, which selects from a plurality of voltage reference signals 354, based on received control signals (not shown).

Generally, voltage regulator circuits 320 and 330 regulate the gain of received differential signals (RXDP and RXDN) into output signals 360 and 362. One skilled in the art will appreciate that, as illustrated, VGA 300 includes an independent voltage regulator for each received differential signal. As such, VGA 300 can be configured to regulate common mode voltage inconsistencies at nodes VCMP 370 and VCMN 372, independently. Further, as shown in the illustrated embodiment, VGA 300 does not require IDACs to calibrate common mode offset voltages.

Moreover, as shown in the illustrated embodiment, VGA 300 includes a separate CM node for each input differential signal. As shown in the illustrated embodiment, VGA 300 can adjust each CM node VCMP 370 and VCMN 372 in opposite directions, to provide a desired common mode offset. In one embodiment, VGA 300 operating in AC coupled mode does not produce DC current (other than leakage current, if any) in either RTERM 342 or 344. One skilled in the art will appreciate that this reduction in current through RTERMs 342 and 344 reduces the power consumption of VGA 300 relative to the prior art approaches described above.

Additionally, in one embodiment, voltage regulator 330 can be configured with a relatively low power overhead. For example, in one embodiment, voltage regulator 330 can be configured with a static current consumption of less than 50 microAmperes (uA). So configured, in one embodiment, VGA 300 can achieve a reduction of twenty times the current of a comparable prior art VGA.

Furthermore, in one embodiment, VGA 300 can be configured such that, in DC coupled mode, a 100 mV reduction at VCMP 370 (or VCMN 372) corresponds to a 50 mV offset at RXDP (or RXDN). So configured, VGA 300 reduces the termination current by 2 mA as compared to a comparable prior art VGA (assuming 50 ohm matched source resistance and zero power overhead for common mode offset calibration). Thus, VGA 300 can be configured to achieve a significant reduction in power consumption as compared to a comparable prior art VGA.

Additionally, one skilled in the art will understand that VGA 300 also presents a less complicated design than a comparable prior art VGA. Specifically, VGA 300 does not require IDAC components. Further, in some embodiments, voltage regulator 330 can be implemented as a copy of voltage regulator 320. As such, both design time and circuit area can be minimized, especially as compared to a comparable prior art VGA.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A variable gain amplifier, comprising:
 a first common mode (CM) node configured to receive a first differential signal of a pair of differential signals;
 a first regulator coupled to the first CM node, the first regulator configured to generate a first CM offset;
 a second CM node configured to receive a second differential signal of the pair of differential signals; and
 a second regulator coupled to the second CM node, the second regulator configured to generate a second CM offset.

2. The variable gain amplifier of claim 1, further comprising a first multiplexor coupled to the first regulator, the first multiplexor configured to select a first voltage reference signal from a first plurality of voltage reference signals.

3. The variable gain amplifier of claim 2, further comprising a second multiplexor coupled to the second regulator, the second multiplexor configured to select a second voltage reference signal from a second plurality of voltage reference signals.

4. The variable gain amplifier of claim 1, wherein the second regulator is configured for static current consumption of less than 50 microAmperes.

5. The variable gain amplifier of claim 1, wherein the first CM offset and the second CM offset together comprise a net CM offset, the net CM offset configured to replace a current source net offset.

6. The variable gain amplifier of claim 1, further comprising:
 wherein the variable gain amplifier is configured to operate in a direct current (DC) mode and an alternating current (AC) mode; and
 wherein the variable gain amplifier operating in the DC mode is configured to receive a well-defined common DC voltage signal.

7. A variable gain amplifier, comprising:
 a first common mode (CM) node;
 a first resistor coupled to the first CM node and to ground;
 a first regulator coupled to the first CM node, the first regulator configured to generate a first CM offset;
 a second resistor coupled to the first CM node and to a first differential output signal;
 a first capacitor coupled to the second resistor and the first differential output signal;
 a third resistor coupled to the first capacitor and configured to receive a first differential input signal;
 a second CM node;
 a fourth resistor coupled to the second CM node and to ground;
 a second regulator coupled to the second CM node, the second regulator configured to generate a second CM offset;
 a fifth resistor coupled to the second CM node and to a second differential output signal;
 a second capacitor coupled to the fifth resistor and the second differential output signal; and
 a sixth resistor coupled to the second capacitor and the third resistor, the sixth resistor configured to receive a second differential input signal.

8. The variable gain amplifier of claim 7, further comprising a first multiplexor coupled to the first regulator, the first multiplexor configured to select a first voltage reference signal from a first plurality of voltage reference signals.

9. The variable gain amplifier of claim 8, further comprising a second multiplexor coupled to the second regulator, the second multiplexor configured to select a second voltage reference signal from a second plurality of voltage reference signals.

10. The variable gain amplifier of claim 7, wherein the second regulator is configured for static current consumption of less than 50 microAmperes.

11. The variable gain amplifier of claim 7, wherein the first CM offset and the second CM offset together comprise a net CM offset, the net CM offset configured to replace a current source net offset.

12. The variable gain amplifier of claim 7, further comprising:
 wherein the variable gain amplifier is configured to operate in a direct current (DC) mode and an alternating current (AC) mode; and
 wherein the variable gain amplifier operating in the DC mode is configured to receive a well-defined common DC voltage signal.

13. A variable gain amplifier, comprising:
 a first common mode (CM) node;
 a first resistor coupled to the first CM node and to ground;
 a first regulator coupled to the first CM node, the first regulator configured to generate a first CM offset;
 wherein the first regulator comprises a first opamp and a first p-type transistor;
 a second resistor coupled to the first CM node and to a first differential output signal;
 a first capacitor coupled to the second resistor and the first differential output signal;
 a third resistor coupled to the first capacitor and configured to receive a first differential input signal;
 a second CM node;
 a fourth resistor coupled to the second CM node and to ground;
 a second regulator coupled to the second CM node, the second regulator configured to generate a second CM offset;
 a fifth resistor coupled to the second CM node and to a second differential output signal;
 a second capacitor coupled to the fifth resistor and the second differential output signal; and
 a sixth resistor coupled to the second capacitor and the third resistor, the sixth resistor configured to receive a second differential input signal.

14. The variable gain amplifier of claim 13, further comprising a first multiplexor coupled to the first regulator, the first multiplexor configured to select a first voltage reference signal from a first plurality of voltage reference signals.

15. The variable gain amplifier of claim 14, further comprising a second multiplexor coupled to the second regulator, the second multiplexor configured to select a second voltage reference signal from a second plurality of voltage reference signals.

16. The variable gain amplifier of claim 13, wherein the second regulator is configured for static current consumption of less than 50 microAmperes.

17. The variable gain amplifier of claim 13, wherein the first CM offset and the second CM offset together comprise a net CM offset, the net CM offset configured to replace a current source net offset.

18. The variable gain amplifier of claim 13, further comprising:

wherein the variable gain amplifier is configured to operate in a direct current (DC) mode and an alternating current (AC) mode; and wherein the variable gain amplifier operating in the DC mode is configured to receive a well-defined common DC voltage signal.

19. The variable gain amplifier of claim 13, wherein the second regulator comprises a second opamp and a second p-type transistor.

* * * * *